(12) United States Patent
Diaz et al.

(10) Patent No.: US 11,735,259 B2
(45) Date of Patent: *Aug. 22, 2023

(54) READ METHOD, WRITE METHOD AND MEMORY CIRCUIT USING THE SAME

(71) Applicant: Taiwan Semiconductor Manufacturing Company, Ltd., Hsinchu (TW)

(72) Inventors: Carlos H. Diaz, Los Altos Hills, CA (US); Hung-Li Chiang, Taipei (TW); Tzu-Chiang Chen, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/743,480

(22) Filed: May 13, 2022

(65) Prior Publication Data

US 2022/0270682 A1 Aug. 25, 2022

Related U.S. Application Data

(63) Continuation of application No. 17/016,398, filed on Sep. 10, 2020, now Pat. No. 11,367,482.

(60) Provisional application No. 62/928,343, filed on Oct. 30, 2019.

(51) Int. Cl.
*G11C 13/00* (2006.01)
*G11C 11/16* (2006.01)

(52) U.S. Cl.
CPC ........ *G11C 13/004* (2013.01); *G11C 11/1659* (2013.01); *G11C 11/1673* (2013.01); *G11C 11/1675* (2013.01); *G11C 13/003* (2013.01); *G11C 13/0004* (2013.01); *G11C 13/0069* (2013.01); *G11C 2013/0045* (2013.01); *G11C 2213/79* (2013.01)

(58) Field of Classification Search
CPC .............. G11C 13/004; G11C 11/1659; G11C 11/1673; G11C 11/1675; G11C 13/0004; G11C 13/003; G11C 13/0069; G11C 2013/0045; G11C 2213/79; G11C 11/1657; G11C 13/0028; G11C 13/0033; G11C 2213/82
See application file for complete search history.

(56) References Cited

U.S. PATENT DOCUMENTS 11,367,482 B2 * 6/2022 Diaz .................. G11C 13/0004

* cited by examiner

*Primary Examiner* — Hien N Nguyen
(74) *Attorney, Agent, or Firm* — JCIPRNET

(57) ABSTRACT

A read method and a write method for a memory circuit are provided, wherein the memory circuit includes a memory cell and a selector electrically coupled to the memory cell. The read method includes applying a first voltage to the selector, wherein a first voltage level of the first voltage is larger than a voltage threshold corresponding to the selector; and applying, after the applying of the first voltage, a second voltage to the selector to sense one or more bit values stored in the memory cell, wherein a second voltage level of the second voltage is constant and smaller than the voltage threshold, wherein a first duration of the applying of the first voltage is smaller than a second duration of the applying of the second voltage, wherein the second voltage is applied following the end of the first duration.

20 Claims, 12 Drawing Sheets

READ METHOD, WRITE METHOD AND MEMORY CIRCUIT USING THE SAME

CROSS-REFERENCE TO RELATED APPLICATION

This application is a continuation application of and claims the priority benefit of a prior application Ser. No. 17/016,398, filed on Sep. 10, 2020, now allowed. This application claims the priority benefit of U.S. provisional application Ser. No. 62/928,343, filed on Oct. 30, 2019. The entirety of the above-mentioned patent application is hereby incorporated by reference herein and made a part of this specification.

BACKGROUND

The improvement in integration density of electronic components (e.g., transistors, diodes, resistors, capacitors, etc.) in integrated circuits (IC) has come from shrinking the semiconductor process node, which entails reductions in operating voltage and current consumption of electronic circuits developed in the semiconductor process node. Accordingly, access speed of a memory device (also referred to as memory unit, memory circuit) is expected to become faster, and the management of the read voltage applied onto the memory device becomes more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
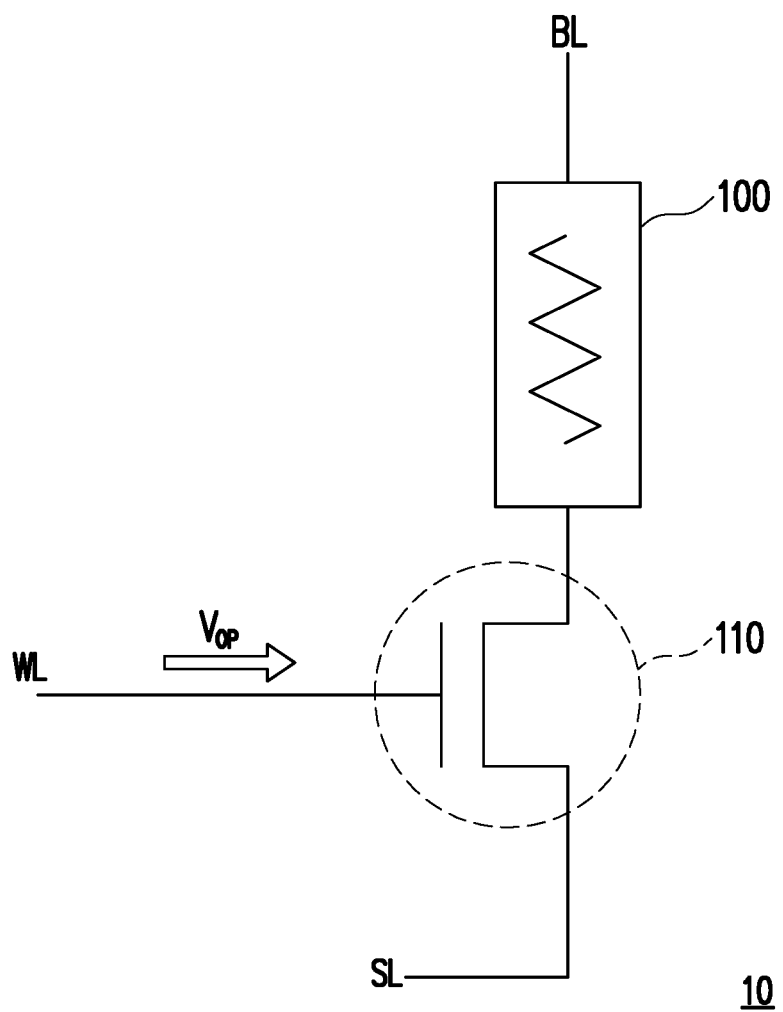
FIG. 1 illustrates a schematic diagram of a memory circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

A memory circuit or a memory unit includes a memory cell and a selector. Referring to FIG. 1, for example, a memory circuit 10 of a RRAM of 1T1R configuration may include a resistor 100 and a transistor 110. A first terminal of the resistor 100 is coupled to a bit line BL, a second terminal of the resistor 100 is coupled to a first terminal of the transistor 110, a control terminal of the transistor 110 is coupled to a word line WL, a second terminal of the transistor 110 is coupled to a source line SL.

The resistor 100 is configured to store different bit values (e.g., logic 0 and 1) by the resistance state (also referred to as resistance level) of the resistor 100, wherein the resistance state of the resistor 100 may be set/programmed to a high resistance state or a low resistance state by applying the write voltage (also called the program voltage). To read out the bit value(s) stored/programmed from the memory cell 100, after the selector 110 is turned-on (e.g., activated) by applying an operation voltage $V_{op}$, a read voltage having a lower magnitude than the magnitudes of the threshold voltages is applied, and based on a magnitude of a corresponding current (the current varies because of the resistance state of the memory cell 100) conducting through the memory cell 100, the bit value (e.g., logic state) written in the memory cell 100 can be determined.

In one embodiment, the read/write operation is done by a read/write voltage having a single amplitude. For example, regarding a read operation, the waveform of the applied voltage V0 has a single amplitude of which the height/magnitude/voltage level (e.g., $V_{read0}$) is larger than a threshold voltage $V_{TH}$ corresponding to the selector of the memory circuit. At timepoint $T_1$, the read voltage V0 is applied on the selector to turn on the selector. The selector may be turned on (e.g., be activated) by a voltage having voltage level larger than a threshold voltage $V_{TH}$, and the selector may be maintained in the tuned-on state (activated state) as long as the voltage level of the applied voltage is larger than a hold voltage $V_{hold}$. Assuming that, the selector is turned on at timepoint $T_2$ after the timepoint $T_1$, and the magnitude of the applied read voltage V0 is kept at $V_{read0}$ till the timepoint $T_3$ r the timepoint $T_2$. The duration (time period from timepoints $T_1$ to $T_3$) for whole read operation is predetermined according to the specification of the memory circuit.

Figure 2:
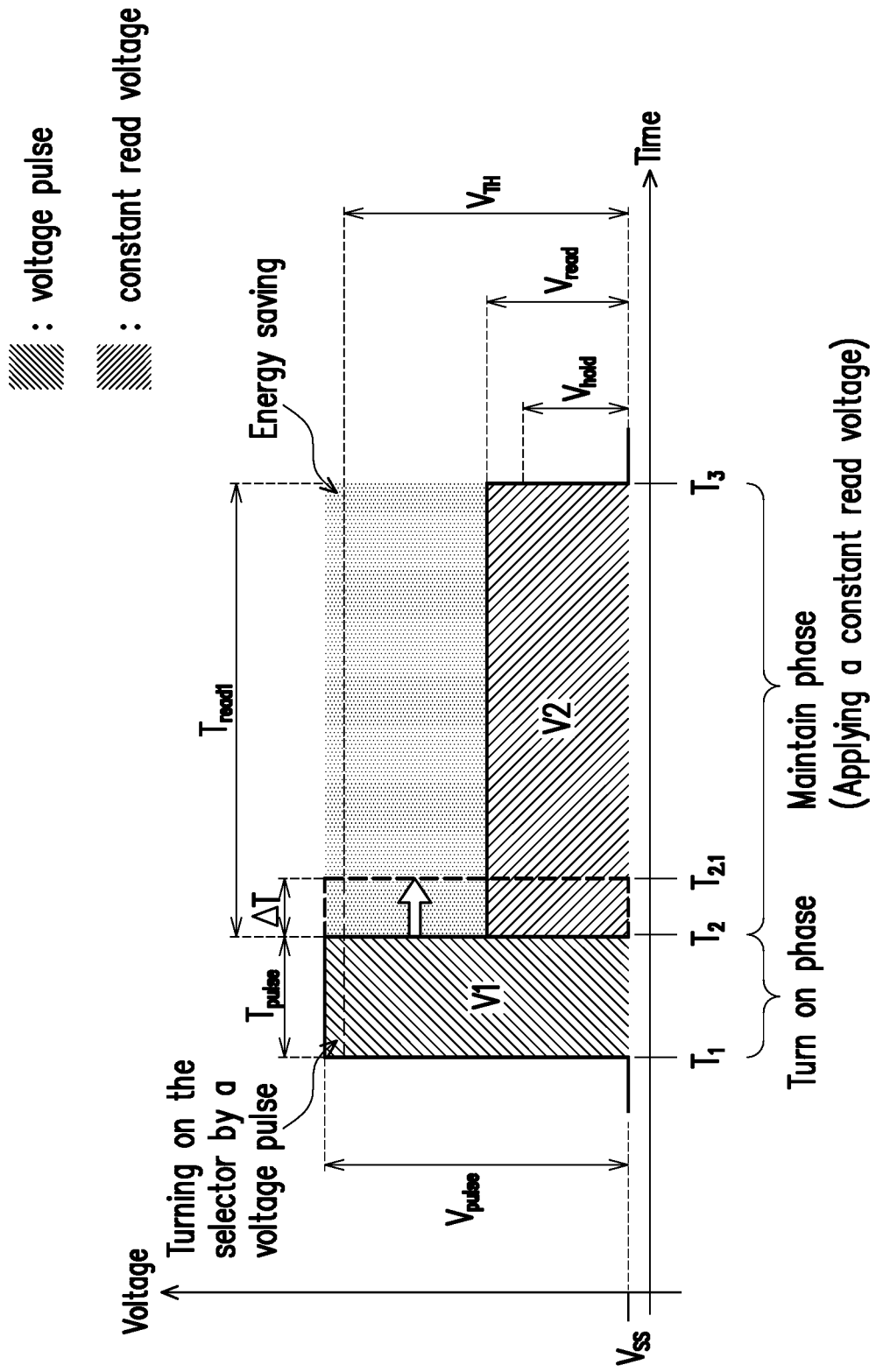
FIG. 2 illustrates a schematic diagram of a waveform of a voltage applied for reading a memory circuit, in accordance with some embodiments of the present disclosure.

In other words, during the entire duration $T_{read0}$(e.g, time period from the timepoints $T_1$ to $T_3$, e.g., the read phase of the read operation indicated by FIG. 2) of the applied voltage V0 (e.g., the width of the amplitude), the magnitude of the applied voltage V0 is kept as $V_{read0}$. However, after the selector is turned on (e.g., at timepoint $T_2$), a large amount of the voltage (also called as snapback voltage) will drop on the selector, and this snapback voltage conducts a snapback current on the memory cell during the period from timepoints $T_2$ to $T_3$. When the memory cell is wrongly programed by the snapback current (the resistance state of the memory cell is changed by the snapback current from the original programmed resistance state to another un expected resistance state) during the read operation, the read disturb event is determined as occurring on this memory cell. The magnitude (e.g., $V_{sb}$) of the snapback voltage is according to the magnitude of read voltage V0 and the hold voltage $V_{hold}$ (e.g., $V_{sb}=V_{read0}-V_{hold}$). For example, it is assumed that the $V_{hold}$ is 0.2V, the $V_{read0}$ is 0.6V, the calculated $V_{sb}$ would be 0.4V.

For suppressing the probability of occurring the read disturb event, some embodiments of the present disclosure provide an improved read method for applying two amplitudes of the operation voltages on the selector.

Referring to FIG. 2, during the entire read operation (e.g., $T_1$ to $T_3$), the waveform of the operation voltage applied on the selector includes a first portion (a portion of the waveform from T1 to T2, also called as the high-amplitude portion) and a second portion (a portion of the waveform from T2 to T3, also called as the low-amplitude portion). The first portion is corresponding to a turn on phase indicated in FIG. 2 and the second portion is corresponding to a maintain phase indicated in FIG. 2.

Regarding the first portion, for example, at timepoint $T_1$, a voltage pulse V1 (also referred to as first voltage) is applied on the selector, wherein the magnitude (voltage level) of first voltage V1 is $V_{pulse}$ which is larger than the threshold voltage $V_{TH}$ corresponding to the selector. The duration $T_{pulse}$ of the first voltage V1 may be predetermined according to the magnitude $V_{pulse}$ of first voltage V1 and the hardware characteristic of the selector which may be varied due to different semiconductor processes of the selector. Furthermore, the actual duration for successfully turning on the selector may be increased by a time margin (e.g., ΔT), e.g., the turn on phase is from timepoints T1 to T2.1. In other words, in the turn one phase of the read operation, the voltage pulse V1 having a higher magnitude $V_{pulse}$ is applied on the selector for at least a duration $T_{pulse}$.

In the embodiment of the present disclosure, in response to the selector is turned on by the voltage pulse V1, another lower voltage pulse (also referred to as second voltage) V2 rather than the voltage pulse V1 is applied to the selector continuously. In other words, connecting to the end of the turn on phase, the maintain phase (the second portion of the waveform) is started.

Regarding the second portion, for example, at timepoint $T_2$, a voltage pulse V2 (also referred to as second voltage) is applied on the selector, wherein the magnitude (voltage level) of second voltage V2 is $V_{read}$ which is smaller than the threshold voltage $V_{TH}$ corresponding to the selector, and the $V_{read}$ is larger than the hold voltage $V_{hold}$, so as to keep the selector in the activated state but much decrease the effect of the snapback voltage generated during the maintain phase. The $V_{read}$ is also smaller than the $V_{pulse}$. $V_{read}$ is determined according to a holding voltage level $V_{hold}$ and a preset voltage level corresponding to a memory type of the memory circuit, wherein the memory type includes Magnetoresistive Random Access Memory (MRAM); Resistive Random Access memory (RRAM); and Phase Change Random Access. Memory (PCRAM).

The duration $T_{read1}$ of the second voltage V2 may be predetermined according to the duration $T_{pulse}$ of first voltage V1 and the specification of the memory circuit corresponding to the read operation, wherein the summation of the duration $T_{pulse}$ and the duration $T_{read1}$ should be set as a time value larger than a preset read time parameter. In other words, in the maintain phase of the read operation, the second voltage V2 having a lower magnitude $V_{read}$ is applied on the selector for at least a duration $T_{read1}$.

It should be noted that the voltage level of the snapback voltage in the embodiment illustrated by FIG. 2 is decreased much since the magnitude (voltage level) $V_{read}$ of second voltage V2 is set to a much lower voltage level comparing to the embodiment illustrated in FIG. 2. For example, it is assumed that the $V_{hold}$ is 0.2V, the $V_{read}$ is 0.3V, the calculated $V_{sb}$ would be 0.1V. Therefore, the snapback current corresponding generated by the snapback voltage in the provided read operation scheme would be decreased much since the caused snapback voltage is suppressed during the maintain phase. In addition, the probability of occurring the read disturb event due to the snapback current is suppressed, too.

Furthermore, by implementing the provided read method, as illustrated in FIG. 2, the energy cost during the maintain phase would be smaller.

Figure 3:
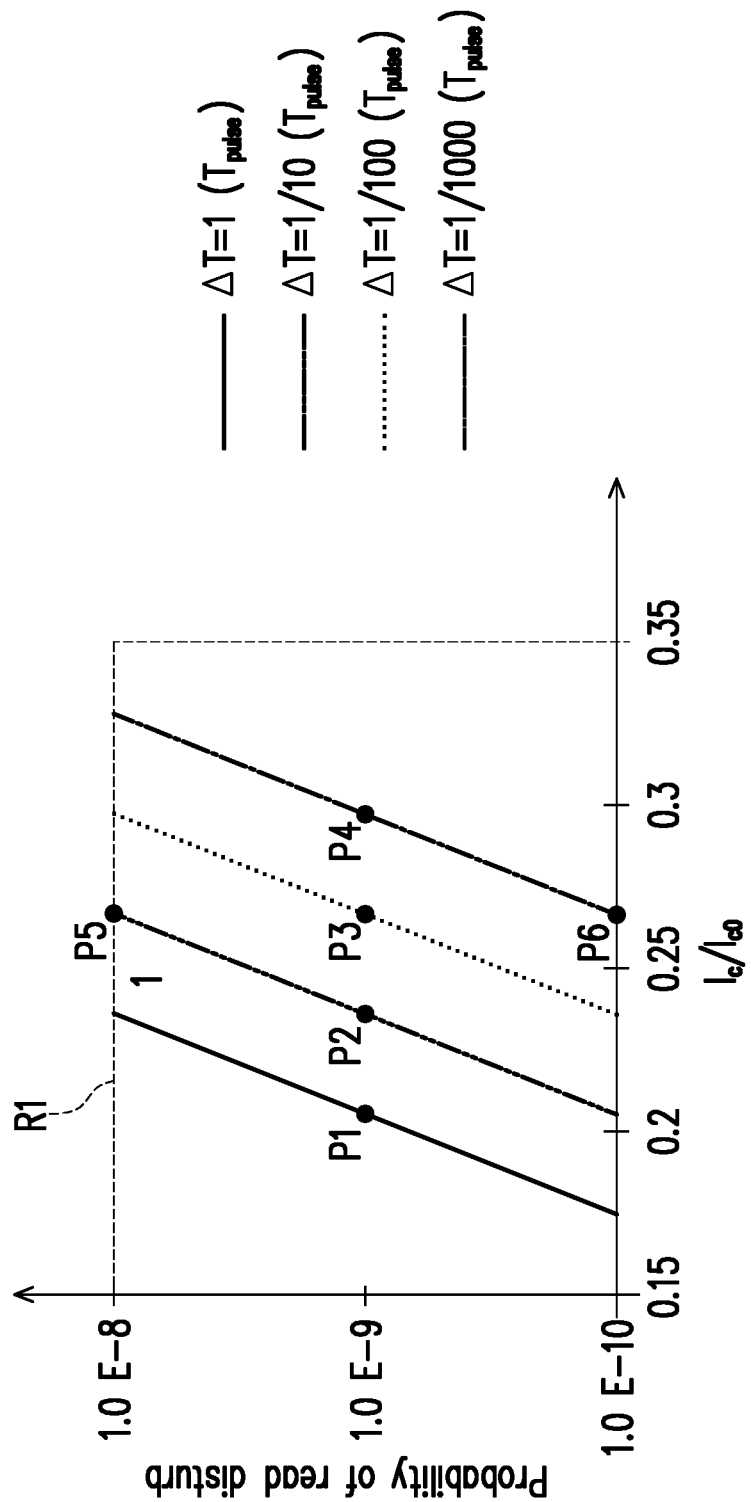
FIG. 3 illustrates a partial relationship diagram between the probability of occurring a read disturb event and a read current ratio, in accordance with some embodiments of the present disclosure.

FIG. 3 illustrates a partial relationship diagram between the probability of occurring a read disturb event and a read current ratio, in accordance with some embodiments of the present disclosure. Referring to FIG. 3, the Y-axis of the relationship diagram represents the probability of occurring the read disturb event, and the X-axis of the relationship diagram represents a read current ratio which is calculated by dividing a read current $I_c$, with a critical switching current $I_{c0}$. The read current ratio may represent the magnitude of the read current $I_c$, conducted on the memory cell during the read operation. The critical switching current $I_{c0}$ represents a current level by which the resistance state of a memory cell may be switched/changed. In other words, the higher read current ratio causing the higher probability of occurring the read disturb event.

As illustrated in FIG. 3, the partial region R1 of a mapping relationship between the read current ration and the probability of read disturb of four embodiments of which the duration margins ΔT are different includes four different lines (each line represent the mapping relationship between the probability of read disturb and the read current ratio under different duration margins). For example, at points P1 to P4, the probabilities of the read disturb are the same (e.g., 1.0E-9). Furthermore, the read current ratio corresponding to the first line (e.g., the line corresponding to duration margin ΔT=1($T_{pulse}$)) is around 0.2; the read current ratio corresponding to the second line (e.g., the line corresponding to duration margin ΔT=1/10($T_{pulse}$)) is around 0.23; the read current ratio corresponding to the third line (e.g., the line corresponding to duration margin ΔT=1/100($T_{pulse}$)) is around 0.26; and the read current ratio corresponding to the fourth line (e.g., the line corresponding to duration margin ΔT=1/1000($T_{pulse}$)) is around 0.3. In other words, smaller duration margin may have higher read current under the same probability of read disturb.

Moreover, under the same read current ration, the lower current margin may have lower probability of read disturb. For example, at points P5, P3 and P6, the read current ratios are the same (e.g., 0.26), but the probabilities of read disturb corresponding to the lines of points P5, P3 and P6 are 1.0E-8, 1.0E-9 and 1.0E-10.

Figure 4:
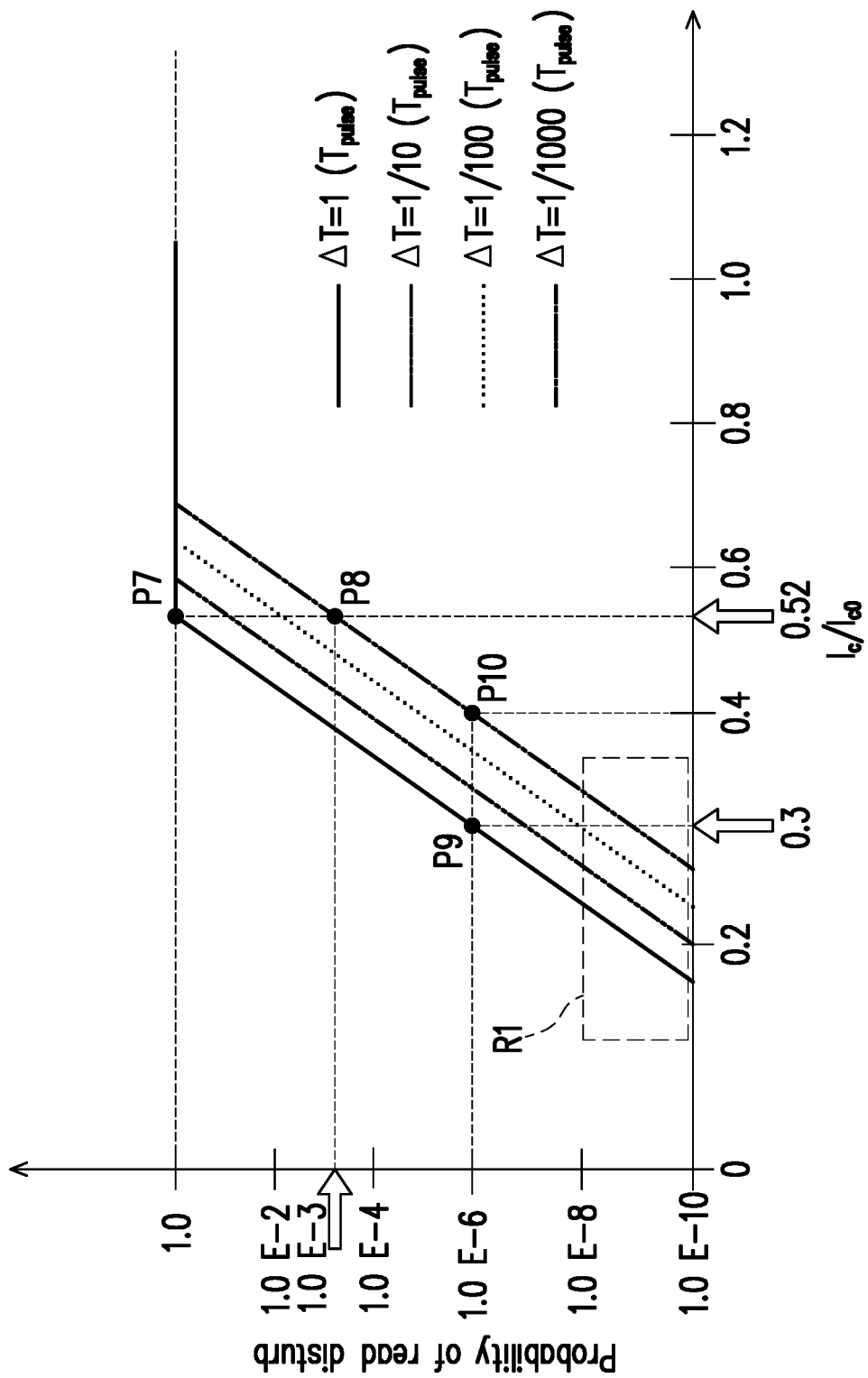
FIG. 4 illustrates a relationship diagram between the probability of occurring a read disturb event and a read current level, in accordance with some embodiments of the present disclosure.

FIG. 4 illustrates a relationship diagram between the probability of occurring a read disturb event and a read current level, in accordance with some embodiments of the present disclosure. Referring to FIG. 4, for example, at points P7 and P8, the read current ratios are the same (e.g., 0.52), but the probabilities of read disturb corresponding to the lines of points P5, P3 and P6 are 1.0 and 1.3E-3. In other words, under the same read current ratio, comparing to one duration margin equal to preset turn-on duration $T_{pulse}$ of the voltage pulse, the smaller duration margin (which is much smaller than the preset turn-on duration $T_{pulse}$ of the voltage pulse, e.g., ΔT=1/1000*($T_{pulse}$)) may much decrease the probability of read disturb.

Furthermore, for example, at points P9 and P10, the probabilities of the read disturb are the same (e.g., 1.0E-6), but the corresponding read current ratios are 0.3 and 0.4. In other words, this fact proves that, comparing to one duration margin equal to preset turn-on duration $T_{pulse}$ of the voltage pulse, the smaller duration margin (which is much smaller than the preset turn-on duration $T_{pulse}$ of the voltage pulse, e.g., ΔT=1/1000*($T_{pulse}$)) may have higher read current without increasing the probability of occurring the read disturb event.

Therefore, for designing a voltage pulse V1 corresponding to the turn on phase (the first portion of the voltage waveform of the read operation), the value of the duration margin ΔT, the probability of read disturb, and the read current ratio should be considered properly.

It should be mentioned that the probability of occurring the read disturb event may be calculated by a function RDR(i) of read current ratio which is calculated by the formula below:

$$RDR(i) = 1 - \exp\left(\frac{-N \times t_{total}}{\tau_0 \exp(\Delta(1-i))}\right)$$

N indicates the total amount of memory cells in the memory array, $t_{total}$ indicates an accumulated time for the read current passing through magnetic tunnel junctions (MTJs) in the memory circuit as the entire duration of the read operation (e.g.$T_{pulse}+T_{read}$), $\tau_0$ indicates an attempt pulse width (1 ns), "i" indicates the read current ratio of $I_c/I_{c0}$. $I_{c0}$ indicates the critical switching current at 0K (Kelvins). Δ is calculated by the formula below:

$$\Delta = \frac{E_B}{K_B T_{op}} = \frac{4\sqrt{A_{ex}(H_K M_S)/2}\, d_{MTJ} t_{FL}}{k_B T_{op}}$$

$E_B$ indicates the energy barrier of the magnetic tunnel junction, $K_B$ indicates the Boltzmann constant, $A_{ex}$ indicates the exchange energy, $H_K$ indicates the anisotropy field, $M_s$ indicates the saturation magnetization of an free layer in the memory circuit, and $t_{FL}$ indicates the thickness of free layer in MTJ. In some embodiments, given a certain film scheme and size of the MTJ, the criteria for current level (e.g., $I_{read}$) of the current and $I_{write}$ are determined by corresponding Δ of the MTJ. In the embodiment, Δ may be "103" at 25° C. and Δ may be "77" at 125° C., respectively.

Figure 5:
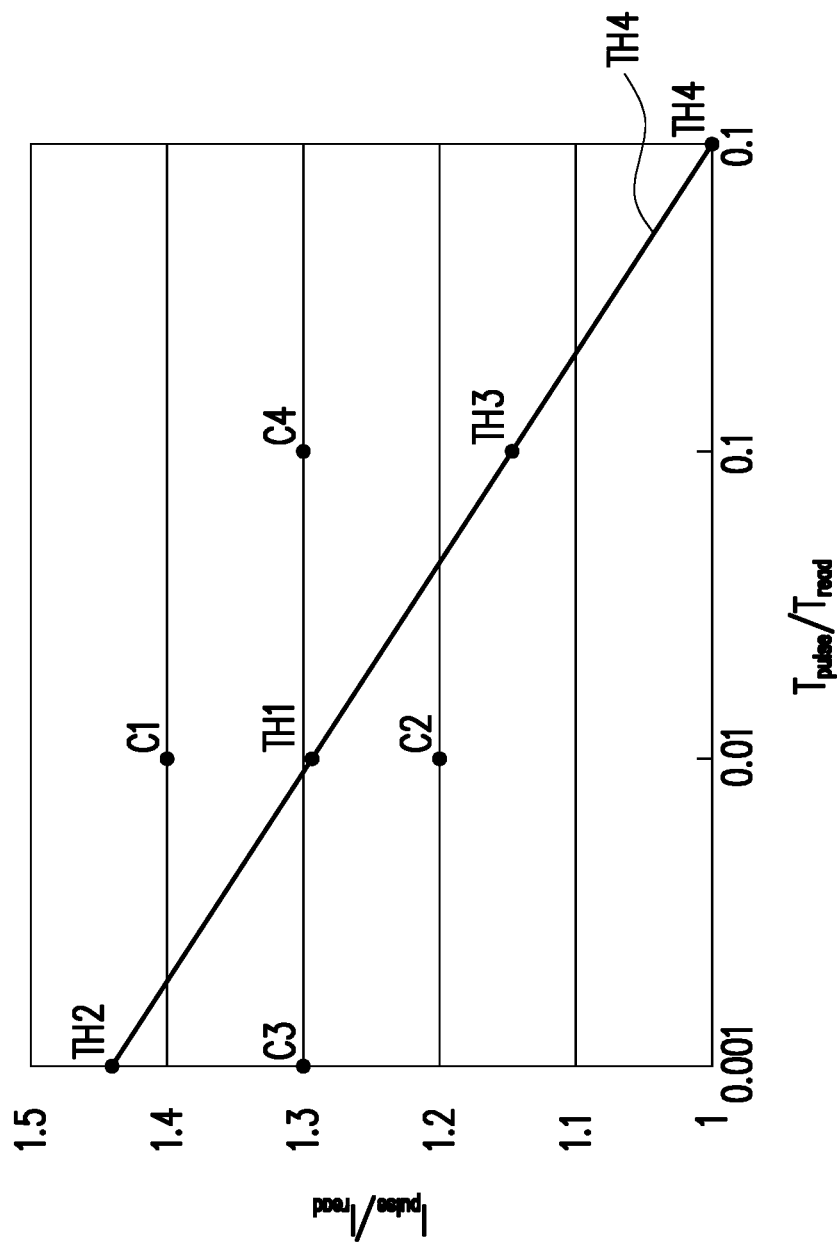
FIG. 5 illustrates a relationship diagram between a current ratio and a duration ratio corresponding to a pulse voltage and a read voltage, in accordance with some embodiments of the present disclosure.

FIG. 5 illustrates a relationship diagram between a current ratio and a duration ratio corresponding to a pulse voltage and a read voltage, in accordance with some embodiments of the present disclosure. Referring to FIG. 5, the Y-axis represents a ratio between a current level of the current (e.g., $I_{pulse}$) generated by the first voltage V1 applied during the turn on phase and a current level (e.g., $I_{read}$) of the current generated by the second voltage V2 applied during the maintain phase. Furthermore, X-axis represents a ratio between the duration (e.g., $T_{pulse}$) corresponding to the first voltage V1 applied during the turn on phase and the duration (e.g., $T_{read}$) corresponding to the second voltage V2 applied during the maintain phase. The line L1 illustrated in FIG. 5 represents a predetermined mathematical relationship (e.g., linear relationship) for setting the corresponding current ratio threshold by the current ratio (e.g., $I_{pulse}/I_{read}$) and for setting the corresponding duration ratio threshold by the duration ratio (e.g., $T_{pulse}/T_{read}$). The duration ratio is inversely proportional to the current ratio threshold according to the linear relationship.

For example, for a duration ratio ($T_{pulse}/T_{read}$) "0.001", the corresponding current ratio threshold "1.45" may be obtained by mapping the duration ratio "0.001" to the threshold point TH2 at the line L1; for a duration ratio "0.01", the corresponding current ratio threshold "1.3" may be obtained by mapping the duration ratio "0.01" to the threshold point TH1 at the line L1; for a duration ratio "0.1", the corresponding current ratio threshold "1.15" may be obtained by mapping the duration ratio "0.1" to the threshold point TH3 at the line L1; for a duration ratio "1", the corresponding current ratio threshold "1" may be obtained by mapping the duration ratio "1" to the threshold point TH4 at the line L1.

Similarly, for a specific current ratio, a corresponding duration ratio may be obtained by the line L1. For example, for a current ratio "1.3", the corresponding duration ratio threshold "0.01" may be obtained by mapping the current ratio "1.3" to the threshold point TH2 at the line L1.

In an embodiment of the present disclosure, for a predetermined duration ratio, the current ratio may be determined according to the current ratio threshold. Specifically, it is assumed that the duration ratio between the first voltage and the second voltage is predetermined as "0.01", the obtained corresponding current ratio threshold would be "1.3". In this example, if the ratio between the current $I_{pulse}$ corresponding to the first voltage and the current $I_{read}$ corresponding to the second voltage is set as a value larger than the current ratio threshold "1.3" (e.g., the $I_{pulse}$ is 1.4 times of the $I_{read}$ as indicated by point C1), the probability of occurring the read disturb event may be larger than a preset probability value (e.g., 100%) or the read disturb event would occur. Furthermore, if the ratio between the current $I_{pulse}$ corresponding to the first voltage and the current $I_{read}$ corresponding to the second voltage is set as another value smaller than the current ratio threshold "1.3" (e.g., the $I_{pulse}$ is 1.2 times of the $I_{read}$ as indicated by point C2), the probability of occurring the read disturb event may be smaller than a preset probability value (e.g., 100%) or the read disturb event would not occur.

In another aspect, it is assumed that the current ratio between the first voltage and the second voltage is predetermined as "1.3", the obtained corresponding duration ratio threshold would be "0.01". In this example, if the ratio between the duration $T_{pulse}$ corresponding to the first voltage and the duration $T_{read}$ corresponding to the second voltage is set as a value larger than the duration ratio threshold "0.01" (e.g., the $T_{pulse}$ is 0.1 times of the $T_{read}$ as indicated by point C4), the probability of occurring the read disturb event may be larger than a preset probability value (e.g., 100%) or the read disturb event would occur. While the preset probability value is too high, the memory circuit may not meet circuit specifications. Furthermore, if the ratio between the duration $T_{pulse}$ corresponding to the first voltage and the duration $T_{read}$ corresponding to the second voltage is set as another value smaller than the duration ratio threshold "0.01" (e.g., the $T_{pulse}$ is 0.001 times of the $T_{read}$ as indicated by point C3), the probability of occurring the read disturb event may be smaller than a preset probability value (e.g., 100%) or the read disturb event would not occur.

Figure 6:
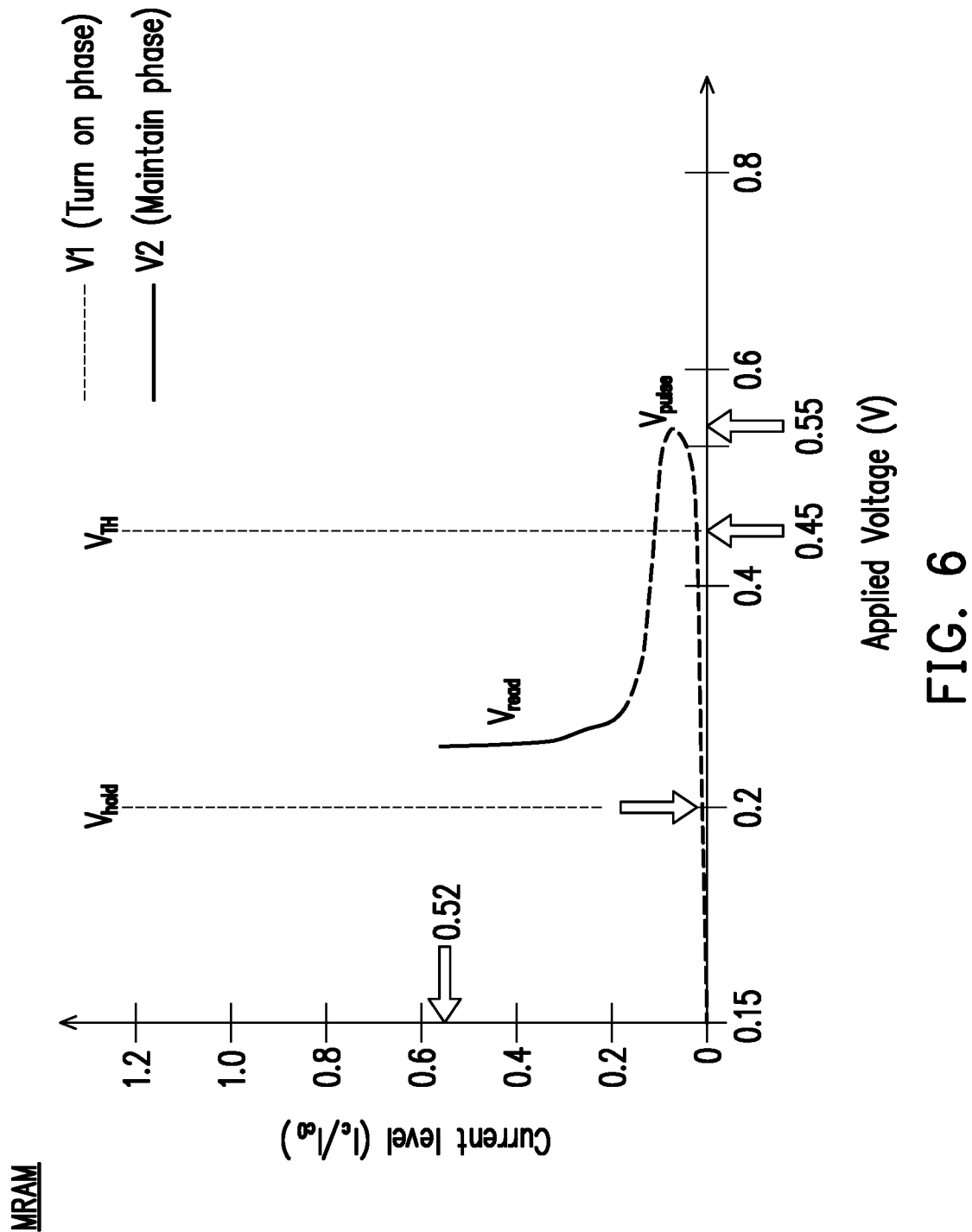
FIG. 6 illustrates a relationship diagram between an applied voltage and a read current level, in accordance with some embodiments of the present disclosure.

FIG. 6 illustrates a relationship diagram between an applied voltage and a read current level, in accordance with some embodiments of the present disclosure. Referring to FIG. 6, the curve illustrated in FIG. 6 includes two portions, a first portion with the dot line which represents the turn on phase and a second portion with the solid line which represent the maintain phase. The first portion of the curve (the dot line) demonstrates the relationship between the read current $I_c$ and the applied voltage (e.g., first voltage V1) during the turn on phase, and the second portion of the curve (the solid line) demonstrates the relationship between the read current $I_c$ and the applied voltage (e.g., second voltage V2) during the maintain phase.

According to the curve, the voltage level of the applied voltage during the turn on phase is rapidly increased to $V_{pulse}$ (e.g., 0.55V) higher than the $V_{TH}$ (e.g., 0.45V), then the voltage level of the applied voltage is decreased to a constant $V_{read}$ (e.g., 0.25V) higher than $V_{hold}$ (e.g., 0.2V) and lower than $V_{TH}$. It should be mentioned that the corresponding read current is slightly increased during the turn on phase, and then dramatically increased during the maintain phase. As illustrated in FIG. 6, the final current level of the read current $I_c$ is 0.52 times of the $I_{c0}$, and the probability of the read disturb would be 1.3E-3 if the duration margin $\Delta T$ is $1/1000(T_{pulse})$.

In the foregoing embodiment, the voltage level of the second voltage applied during the maintain phase is a constant value, but the present disclosure is not limited hereto. For example, in an embodiment of the present disclosure, a current having a constant current level is applied on the selector rather than a constant voltage.

Figure 7:
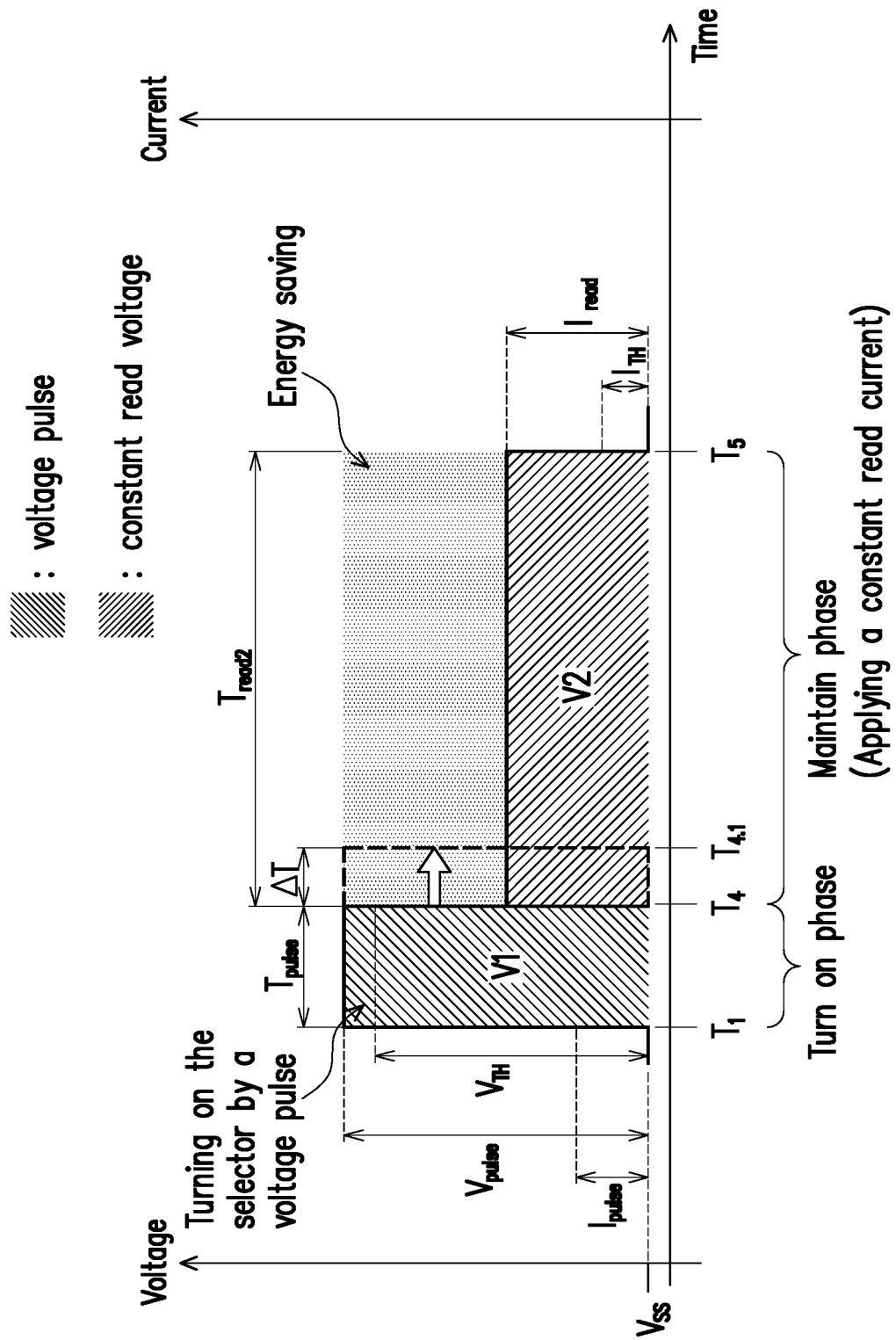
FIG. 7 illustrates a schematic diagram of a waveform of a voltage and a current applied for reading a memory circuit, in accordance with some embodiments of the present disclosure.

FIG. 7 illustrates a schematic diagram of a waveform of a voltage and a current applied for reading a memory circuit, in accordance with some embodiments of the present disclosure. Referring to FIG. 7, during the entire read operation (e.g., $T_1$ to $T_5$), the waveform of the operation voltage applied on the selector includes a first portion (a portion of the waveform from T1 to T4, also called as the high-amplitude portion) and a second portion (a portion of the waveform from T4 to T5, also called as the low-amplitude portion). The first portion is corresponding to a turn on phase indicated in FIG. 7 and the second portion is corresponding to a maintain phase indicated in FIG. 7.

Regarding the first portion, for example, at timepoint $T_1$, a voltage pulse V1 (also referred to as first voltage) is applied on the selector, wherein the magnitude (voltage level) of first voltage V1 is $V_{pulse}$ which is larger than the threshold voltage $V_{TH}$ corresponding to the selector. The duration $T_{pulse}$ of the first voltage V1 may be predetermined according to the magnitude $V_{pulse}$ of first voltage V1 and the hardware characteristic of the selector which may be varied due to different semiconductor processes of the selector. Furthermore, the actual duration for successfully turning on the selector may be increased by a time margin (e.g., $\Delta T$), e.g., the turn on phase is from timepoints T1 to T4.1. In other words, in the turn one phase of the read operation, the voltage pulse V1 having a higher magnitude $V_{pulse}$ is applied on the selector for at least a duration $T_{pulse}$.

In the embodiment of the present disclosure, in response to the selector is turned on by the voltage pulse V1, a read current having a constant current level $I_{read}$ is applied to the selector continuously. In other words, connecting to the end of the turn on phase, the maintain phase (the second portion of the waveform) is started.

Regarding the second portion, for example, at timepoint $T_4$, a current I2 is applied on the selector, wherein the magnitude (current level) of current I2 is $I_{read}$ which is larger than a threshold current $I_{TH}$ and is smaller than a target $I_c/I_{c0}$ corresponding to the selector (the threshold current $I_{TH}$ may be obtained according to the threshold voltage $V_{TH}$). The $I_{read}$ is also larger than the current level $I_{pulse}$ of the current corresponding to the first voltage. The duration $T_{read2}$ of the current I2 may be predetermined according to the duration $T_{pulse}$ of first voltage V1 and the specification of the memory circuit corresponding to the read operation, wherein the summation of the duration $T_{pulse}$ and the duration $T_{read2}$ should be set as a time value larger than a preset read time parameter. In other words, in the maintain phase of the read operation, the current I2 with the constant current level $I_{read}$ is applied on the selector for at least a duration $T_{read2}$.

Furthermore, by implementing the provided read method, as illustrated in FIG. 7, the energy cost during the maintain phase would be smaller comparing to the one embodiment of FIG. 2 because the current level $I_{read}$ is lower than the current level of the current generated by the convention read voltage.

Figure 8A:
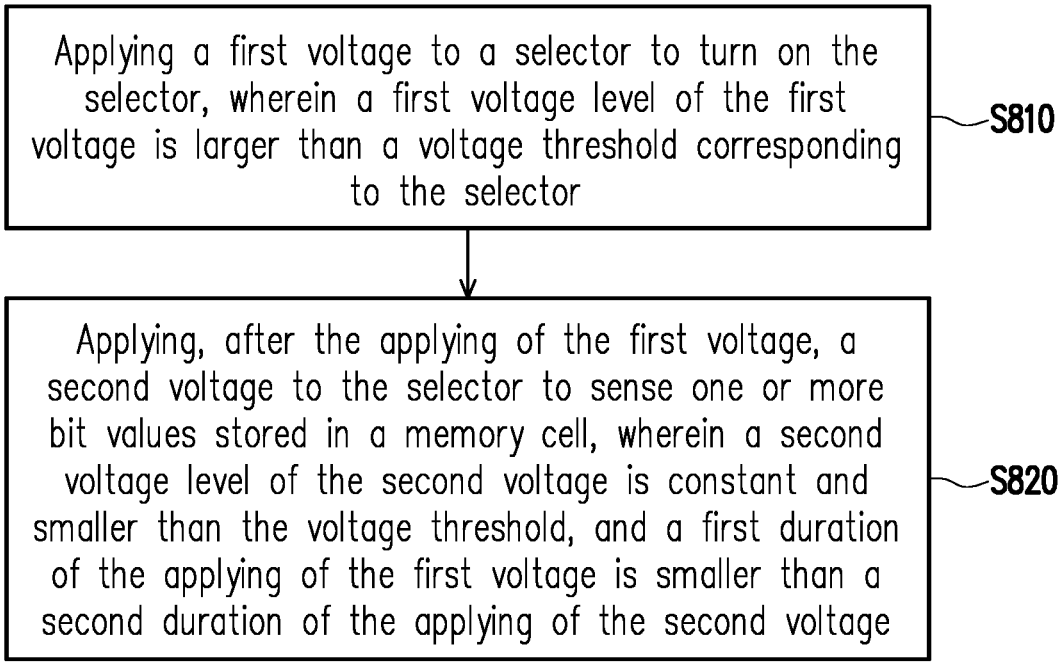
FIG. 8A illustrates a flow chart of a memory read method, in accordance with some embodiments of the present disclosure.

FIG. 8A illustrates a flow chart of a memory read method, in accordance with some embodiments of the present disclosure. The memory read method including steps S810-S820 may be implemented by a controller and at least one voltage generator of the memory circuit 10. Referring to FIG. 8A, in step S810, applying a first voltage to a selector to turn on the selector, wherein a first voltage level of the first voltage is larger than a voltage threshold corresponding to the selector. Next, in step S820, applying, after the applying of the first voltage, a second voltage to the selector to sense one or more bit values stored in a memory cell, wherein a second voltage level of the second voltage is constant and smaller than the voltage threshold, and a first duration of the applying of the first voltage is smaller than a second duration of the applying of the second voltage.

Figure 8B:
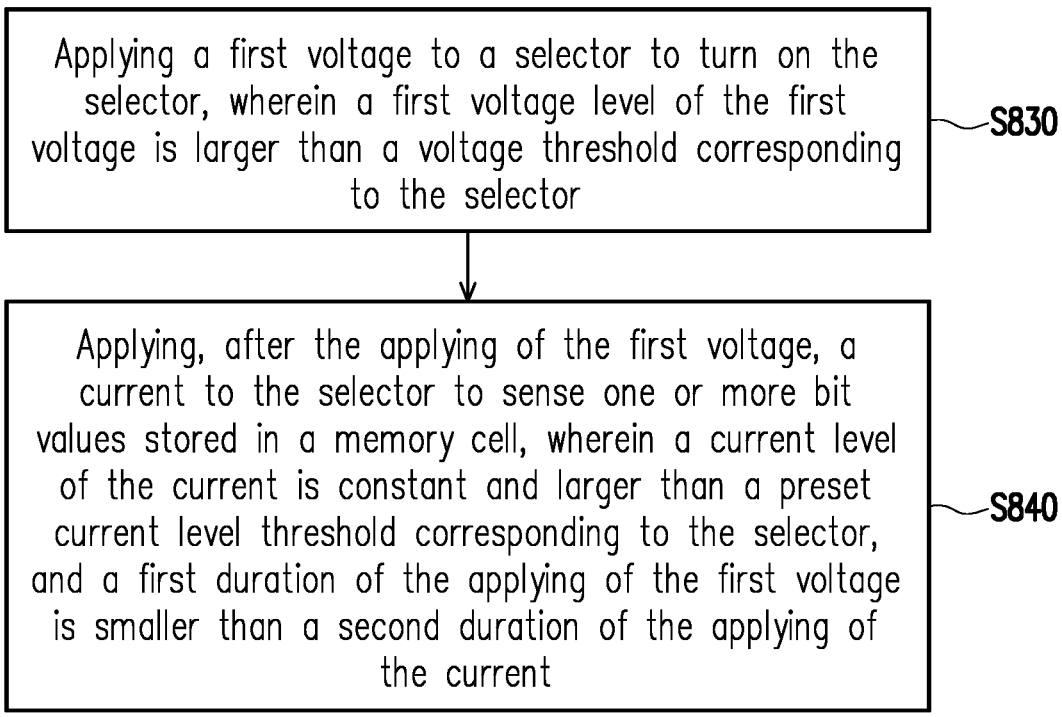
FIG. 8B illustrates a flow chart of a memory read method, in accordance with some embodiments of the present disclosure.

FIG. 8B illustrates a flow chart of a memory read method, in accordance with some embodiments of the present disclosure. The memory read method including steps S830-S840 may be implemented by a controller at least one voltage generator of the memory circuit 10. Referring to FIG. 8B, in step S830, applying a first voltage to a selector to turn on the selector, wherein a first voltage level of the first voltage is larger than a voltage threshold corresponding to the selector. Next, in step S840, applying, after the applying of the first voltage, a current to the selector to sense one or more bit values stored in a memory cell, wherein a current level of the current is constant and larger than a preset current level threshold corresponding to the selector, and a first duration of the applying of the first voltage is smaller than a second duration of the applying of the current.

In the foregoing embodiments of the present disclosure, the improved scheme of the waveform of the applied voltage for the read operation is provided. In another aspect, the scheme of the waveform of the applied voltage for the write operation may be improved in the similar manner.

Figure 9A:
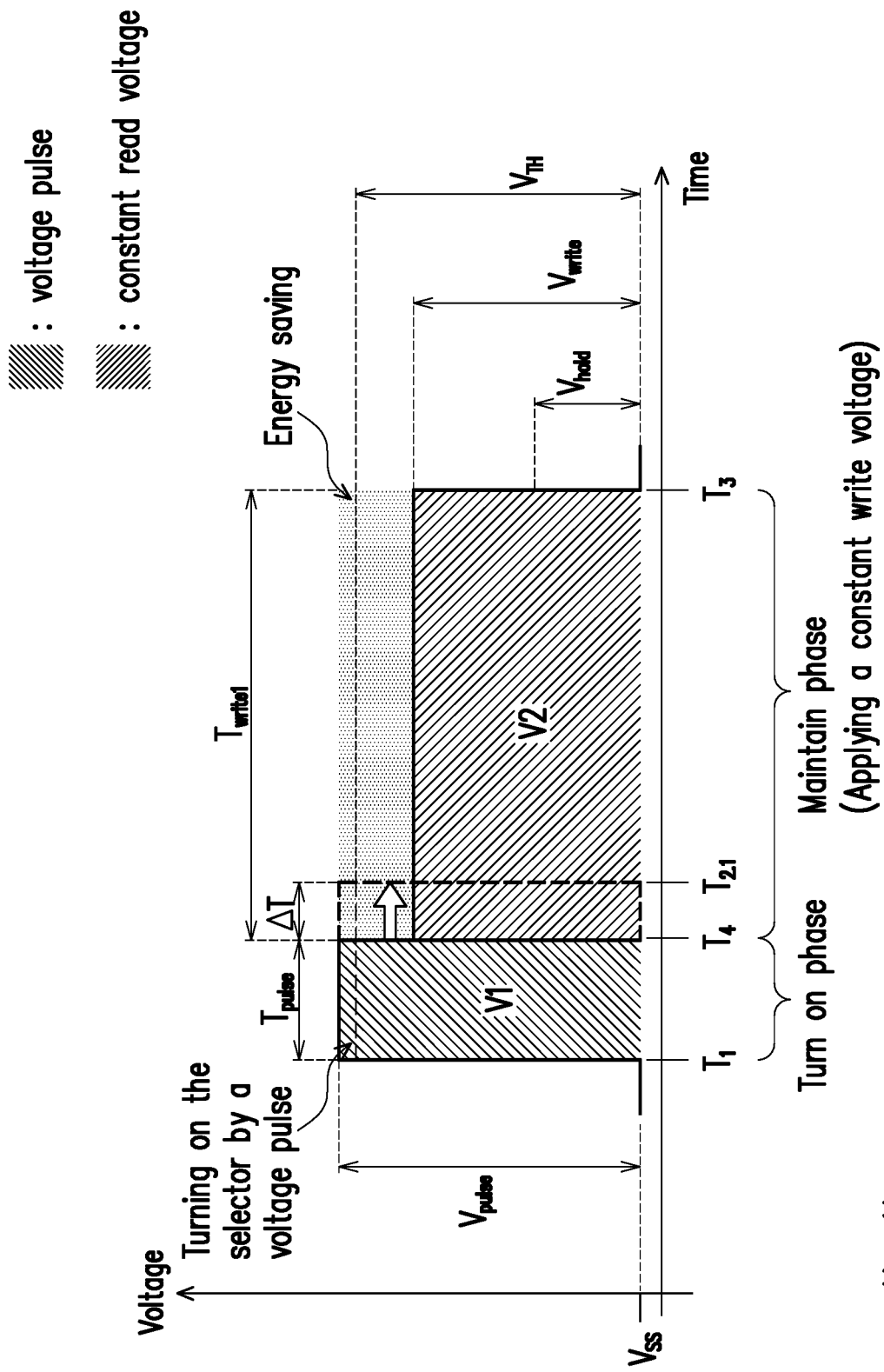
FIG. 9A illustrates a schematic diagram of a waveform of a voltage applied for writing a memory circuit, in accordance with some embodiments of the present disclosure.

FIG. 9A illustrates a schematic diagram of a waveform of a voltage applied for writing a memory circuit, in accordance with some embodiments of the present disclosure. Referring to FIG. 9A, during the entire write operation (e.g., $T_1$ to $T_3$), the waveform of the operation voltage applied on the selector includes a first portion (a portion of the waveform from T1 to T2, also called as the high-amplitude portion) and a second portion (a portion of the waveform from T2 to T3, also called as the low-amplitude portion). The first portion is corresponding to a turn on phase indicated in FIG. 9A and the second portion is corresponding to a maintain phase indicated in FIG. 9A.

Regarding the first portion, for example, at timepoint $T_1$, a voltage pulse V1 (also referred to as first voltage) is applied on the selector, wherein the magnitude (voltage level) of first voltage V1 is $V_{pulse}$ which is larger than the threshold voltage $V_{TH}$ corresponding to the selector. The duration $T_{pulse}$ of the first voltage V1 may be predetermined according to the magnitude $V_{pulse}$ of first voltage V1 and the hardware characteristic of the selector which may be varied due to different semiconductor processes of the selector. Furthermore, the actual duration for successfully turning on the selector may be increased by a time margin (e.g., $\Delta T$), e.g., the turn on phase is from timepoints T1 to T2.1. In other words, in the turn one phase of the write operation, the voltage pulse V1 having a higher magnitude $V_{pulse}$ is applied on the selector for at least a duration $T_{pulse}$.

In the embodiment of the present disclosure, in response to the selector is turned on by the voltage pulse V1, another lower voltage pulse (also referred to as second voltage) V2 rather than the voltage pulse V1 is applied to the selector continuously. In other words, connecting to the end of the turn on phase, the maintain phase (the second portion of the waveform) is started.

Regarding the second portion, for example, at timepoint $T_2$, a voltage pulse V2 (also referred to as second voltage) is applied on the selector, wherein the magnitude (voltage level) of second voltage V2 is $V_{write}$ which is smaller than the threshold voltage $V_{TH}$ corresponding to the selector, and the $V_{write}$ is larger than the hold voltage $V_{hold}$. The $V_{write}$ is also smaller than the $V_{pulse}$ In the maintain phase of the write operation, the second voltage V2 having a lower magnitude $V_{write}$ is applied on the selector for at least a duration $T_{write1}$.

It should be noted that $V_{write}$ is larger than $V_{read}$, so as to program the expected bit value into the memory cell by the current correspondingly generated according to the second voltage V2 having the voltage level $V_{write}$. Furthermore, by implementing the provided read method for these two stages (i.e., the turn-on stage $T_1$-$T_4$ for turning on the selector and the maintain phase/the maintain stage for applying the constant read voltage), as illustrated in FIG. 9A, the energy cost during the maintain phase would be smaller comparing to the embodiment of FIG. 2.

Figure 9B:
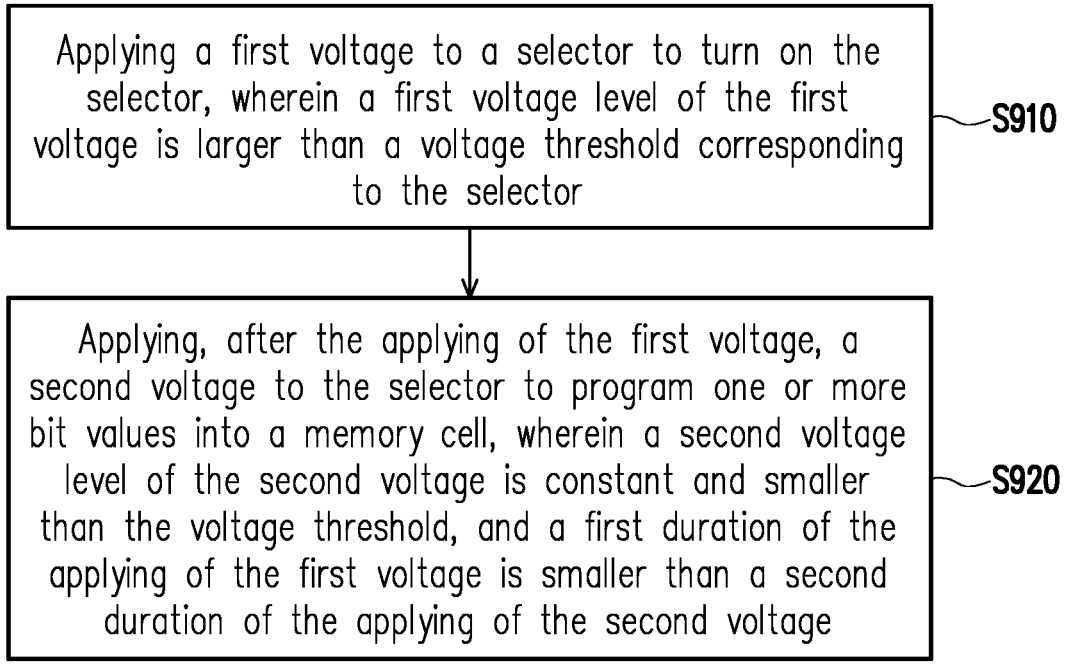
FIG. 9B illustrates a flow chart of a memory write method, in accordance with some embodiments of the present disclosure.

FIG. 9B illustrates a flow chart of a memory write method, in accordance with some embodiments of the present disclosure. The memory write method including steps S910-S920 may be implemented by a controller at least one voltage generator of the memory circuit 10. Referring to FIG. 9B, in step S910, applying a first voltage to a selector to turn on the selector, wherein a first voltage level of the first voltage is larger than a voltage threshold corresponding to the selector. Next, in step S920, applying, after the applying of the first voltage, a second voltage to the selector to program one or more bit values into a memory cell, wherein a second voltage level of the second voltage is constant and smaller than the voltage threshold, and a first duration of the applying of the first voltage is smaller than a second duration of the applying of the second voltage.

Figure 10A:
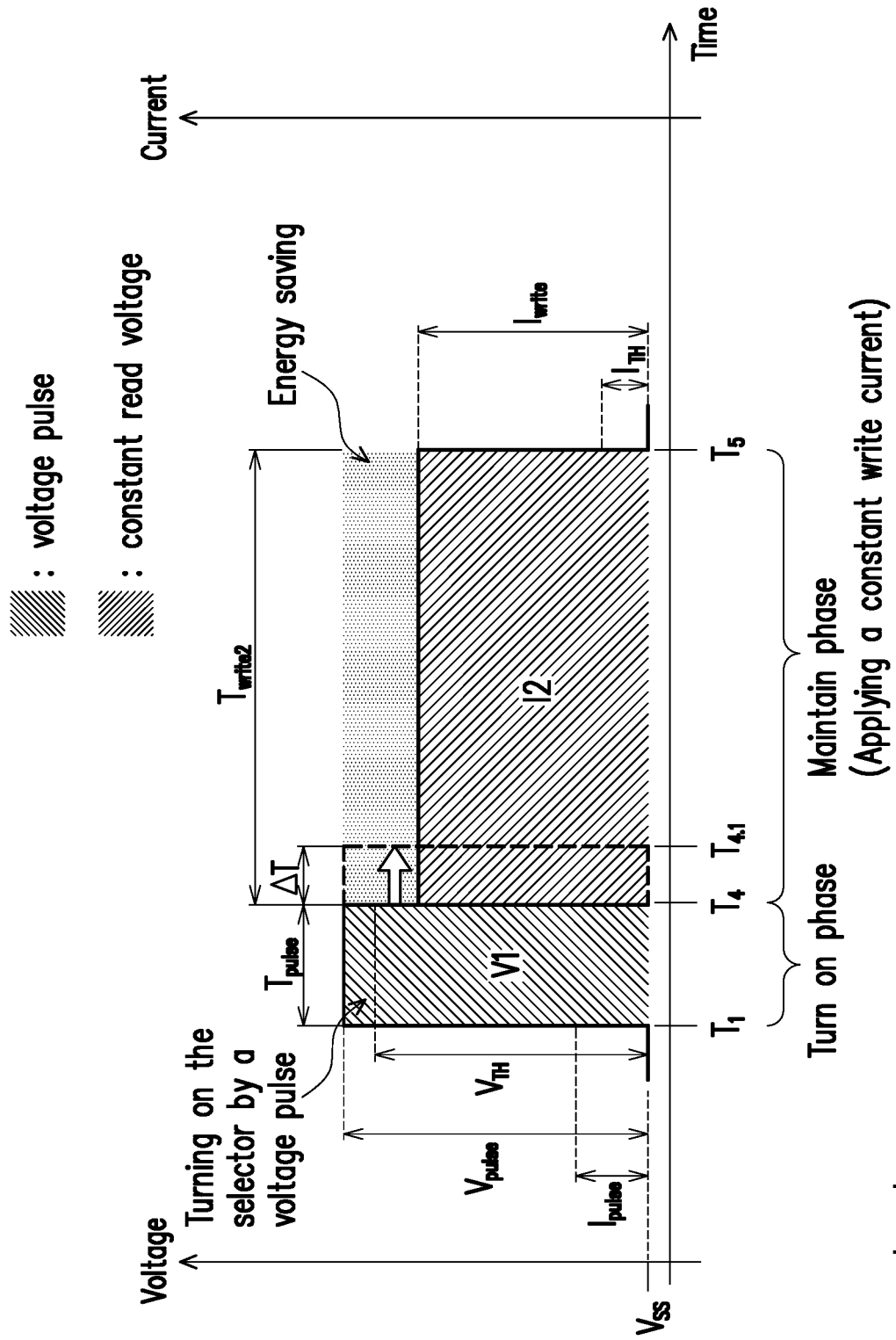
FIG. 10A illustrates a schematic diagram of a waveform of a voltage and a current applied for writing a memory circuit, in accordance with some embodiments of the present disclosure.

FIG. 10A illustrates a schematic diagram of a waveform of a voltage and a current applied for writing a memory circuit, in accordance with some embodiments of the present disclosure. Referring to FIG. 10A, during the entire write operation (e.g., $T_1$ to $T_5$), the waveform of the operation voltage applied on the selector includes a first portion (a portion of the waveform from T1 to T4, also called as the high-amplitude portion) and a second portion (a portion of the waveform from T4 to T5, also called as the low-amplitude portion). The first portion is corresponding to a turn on phase indicated in FIG. 10A and the second portion is corresponding to a maintain phase indicated in FIG. 10A.

Regarding the first portion, for example, at timepoint $T_1$, a voltage pulse V1 (also referred to as first voltage) is applied on the selector, wherein the magnitude (voltage level) of first voltage V1 is $V_{pulse}$ which is larger than the threshold voltage $V_{TH}$ corresponding to the selector. The duration $T_{pulse}$ of the first voltage V1 may be predetermined according to the magnitude $V_{pulse}$ of first voltage V1 and the hardware characteristic of the selector which may be varied due to different semiconductor processes of the selector. Furthermore, the actual duration for successfully turning on the selector may be increased by a time margin (e.g., $\Delta T$), e.g., the turn on phase is from timepoints T1 to T4.1. In other words, in the turn one phase of the write operation, the voltage pulse V1 having a higher magnitude $V_{pulse}$ is applied on the selector for at least a duration $T_{pulse}$.

In the embodiment of the present disclosure, in response to the selector is turned on by the voltage pulse V1, a write current having a constant current level $I_{read}$ is applied to the selector continuously. In other words, connecting to the end of the turn on phase, the maintain phase (the second portion of the waveform) is started.

Regarding the second portion, for example, at timepoint $T_4$, a current I2 is applied on the selector, wherein the magnitude (current level) of current I2 is $I_{write}$ which is larger than a threshold current $I_{TH}$ corresponding to the selector (the threshold current $I_{TH}$ may be obtained according to the threshold voltage $V_{TH}$). The $I_{write}$ is also larger than the current level $I_{pulse}$ of the current corresponding to the first voltage. The duration $T_{write2}$ of the current I2 may be predetermined according to the duration $T_{pulse}$ of first voltage V1 and the specification of the memory circuit corresponding to the write operation.

It should be noted that, by implementing the provided write method, as illustrated in FIG. 10A, the energy cost during the maintain phase would be smaller comparing to the embodiment of FIG. 2 because the current level $I_{write}$ is lower than the current level of the current generated by the convention write voltage. But, in the embodiments, $I_{write}$ is never smaller than $I_{read}$.

Figure 10B:
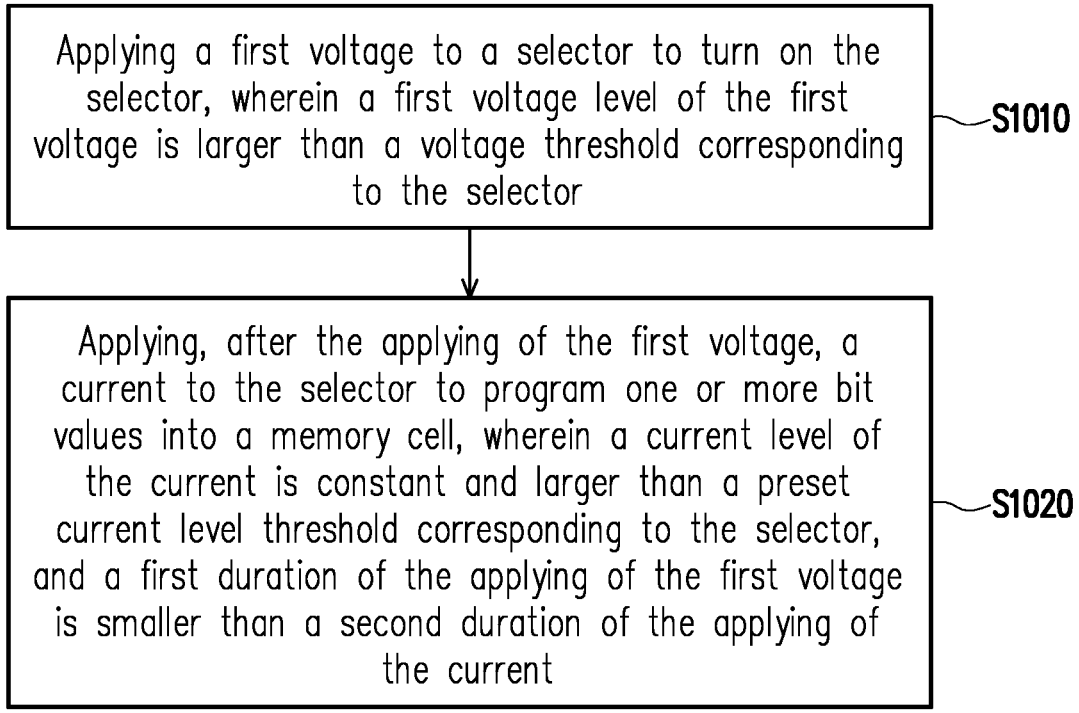
FIG. 10B illustrates a flow chart of a memory write method, in accordance with some embodiments of the present disclosure.

Referring to FIG. 10B, in step S1010, applying a first voltage to a selector to turn on the selector, wherein a first voltage level of the first voltage is larger than a voltage threshold corresponding to the selector. Next, in step S1020, applying, after the applying of the first voltage, a current to the selector to program one or more bit values into a memory cell, wherein a current level of the current is constant and larger than a preset current level threshold corresponding to the selector, and a first duration of the applying of the first voltage is smaller than a second duration of the applying of the current.

Based on the foregoing embodiments, the provided read method, write method and the memory circuit using the same are capable of suppressing the probability of the read disturb during the read operation, and saving the energy cost during the read/write operation while keeping the accuracy of the read/write operation. Therefore, the efficiency and the accuracy of read/write operation performed on the memory circuit would be improved by the provided read/write method.

In an embodiment of the present disclosure, a read method for a memory circuit is provided, wherein the memory circuit comprises a memory cell and a selector electrically coupled to the memory cell. The method includes applying a first voltage to the selector, wherein a first voltage level of the first voltage is larger than a voltage threshold corresponding to the selector; and applying, after the applying of the first voltage, a second voltage to the selector to sense one or more bit values stored in the memory cell, wherein a second voltage level of the second voltage is constant and smaller than the voltage threshold, wherein a first duration of the applying of the first voltage is smaller than a second duration of the applying of the second voltage, wherein the second voltage is applied following the end of the first duration.

In an embodiment of the present disclosure, a memory circuit is provided. The memory circuit includes a memory cell and a selector electrically coupled to the memory cell, wherein a first voltage is applied to the selector, wherein a first voltage level of the first voltage is larger than a voltage threshold corresponding to the selector, wherein, after the applying of the first voltage, a second voltage is applied to the selector to sense one or more bit values stored in the memory cell a, wherein a second voltage level of the second voltage is constant and smaller than the voltage threshold, wherein a first duration of the applied first voltage is smaller than a second duration of the applied second voltage, wherein the second voltage is applied following the end of the first duration.

In an embodiment of the present disclosure, a write method for a memory circuit is provided. The write method includes applying a first voltage to the selector to turn on the selector, wherein a first voltage level of the first voltage is larger than a voltage threshold corresponding to the selector; and applying a second voltage to the selector to program one or more bit values into the memory cell after the applying of the first voltage, wherein a second voltage level of the second voltage is constant and smaller than the voltage threshold, wherein a first duration of the applying of the first voltage is smaller than a second duration of the applying of the second voltage, wherein the second voltage is applied following the end of the first duration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A read method for a memory circuit, wherein the memory circuit comprises a memory cell and a selector electrically coupled to the memory cell, the method comprising:
    applying a first voltage to the selector, wherein a first voltage level of the first voltage is larger than a voltage threshold corresponding to the selector; and
    applying, after the applying of the first voltage, a read current to the selector to sense one or more bit values stored in the memory cell, wherein a read current level of the read current is constant and greater than a preset current level threshold,
    wherein a first duration of the applying of the first voltage is smaller than a second duration of the applying of the read current,
    wherein the read current is applied following an end of the first duration.

2. The read method of claim 1, wherein the first voltage is configured to turn on the selector,
    wherein in response to the selector is turned on by the applied first voltage, a snapback current corresponding to the first voltage is generated according to a snapback voltage corresponding to the first voltage, wherein a snapback current level of the snapback current is determined according to a snapback voltage level of the snapback voltage,
    wherein the snapback voltage level is determined as a difference calculated by subtracting a holding voltage level from the first voltage level.

3. The read method of claim 2, wherein a read current level of the read current is determined according to a read current ratio, and the read current ratio is obtained by dividing the read current with a critical switching current.

4. The read method of claim 3, wherein a duration ratio between the first duration and the second duration is configured to set a current ratio threshold according to a predetermined mathematical relationship between the duration ratio and the current ratio threshold,
    wherein the smaller duration ratio is configured, the larger current ratio threshold is set,
    wherein in response to a current ratio between the first current level and the read current level being larger than the set current ratio threshold, a probability of occurring a read disturb event on the memory cell is more than a preset probability value, wherein one or more further bit values is programmed into the memory cell in the read disturb event, wherein the one or more further bit values is different from the one or more bit values stored in the memory cell.

5. The read method of claim 4, wherein the predetermined mathematical relationship is a linear relationship,
wherein the duration ratio is inversely proportional to the current ratio threshold according to the linear relationship.

6. The read method of claim 4, wherein a probability of occurring the read disturb event is determined according to a time parameter corresponding to a programming operation, the amount of a plurality of memory cells in a memory array to which the memory cell belongs, the read current ratio, the first duration and the second duration.

7. The read method of claim 1, wherein the read current level is determined according to a target read current ratio corresponding to the selector, and the second duration is determined according to a memory type of the memory circuit.

8. The read method of claim 7, wherein the memory type of the memory circuit comprises one of an magnetoresistive Random Access Memory (MRAM), an resistive Random Access memory (RRAM), and a phase Change Random Access Memory (PCRAM).

9. The read method of claim 1, further comprising:
after the applying of the first voltage, applying a second voltage rather than the read current to the selector to sense the one or more bit values stored in the memory cell, wherein a second voltage level of the second voltage is constant and smaller than the voltage threshold,
wherein a third duration of the applying of the second voltage is larger than the first duration of the applying of the first voltage,
wherein the second voltage is applied following the end of the first duration.

10. A memory circuit, comprising:
a memory cell; and
a selector, electrically coupled to the memory cell,
wherein a first voltage is applied to the selector, wherein a first voltage level of the first voltage is larger than a voltage threshold corresponding to the selector,
wherein, after the applying of the first voltage, a second current is applied to the selector to sense one or more bit values stored in the memory cell, wherein a second current level of the second current is constant and greater than a preset current level threshold,
wherein a first duration of the applied first voltage is smaller than a second duration of the applied second current,
wherein the second current is applied following an end of the first duration.

11. The memory circuit of claim 10, wherein the first voltage is configured to turn on the selector,
wherein in response to the selector is turned on by the applied first voltage, a snapback current corresponding to the first voltage is generated according to a snapback voltage corresponding to the first voltage, wherein a snapback current level of the snapback current is determined according to a snapback voltage level of the snapback voltage,
wherein the snapback voltage level is determined as a difference calculated by subtracting a holding voltage level from the first voltage level.

12. The memory circuit of claim 11, wherein a read current level of the read current is determined according to a read current ratio, and the read current ratio is obtained by dividing the read current with a critical switching current.

13. The memory circuit of claim 12, wherein
a duration ratio between the first duration and the second duration is configured to set a current ratio threshold according to a predetermined mathematical relationship between the duration ratio and the current ratio threshold,
wherein the smaller duration ratio is configured, the larger current ratio threshold is set,
wherein in response to a current ratio between the first current level and the second current level being larger than the set current ratio threshold, a probability of occurring a read disturb event on the memory cell is more than a preset probability value, wherein one or more further bit values is programmed into the memory cell in the read disturb event, wherein the one or more further bit values is different from the one or more bit values stored in the memory cell.

14. The method of claim 13, wherein the predetermined mathematical relationship is a linear relationship,
wherein the duration ratio is inversely proportional to the current ratio threshold according to the linear relationship.

15. The memory circuit of claim 13, wherein a probability of occurring the read disturb event is determined according to a time parameter corresponding to a programming operation, the amount of a plurality of memory cells in a memory array to which the memory cell belongs, the read current ratio, the first duration and the second duration.

16. The memory circuit of claim 10, wherein the read current level is determined according to a target read current ratio corresponding to the selector, and the second duration is determined according to a memory type of the memory circuit.

17. The memory circuit of claim 16, wherein the memory type of the memory circuit comprises one of an magnetoresistive Random Access Memory (MRAM), an resistive Random Access memory (RRAM), and a phase Change Random Access Memory (PCRAM).

18. The memory circuit of claim 10, wherein
after the applying of the first voltage, applying a second voltage rather than the read current to the selector to sense the one or more bit values stored in the memory cell, wherein a second voltage level of the second voltage is constant and smaller than the voltage threshold,
wherein a third duration of the applying of the second voltage is larger than the first duration of the applying of the first voltage,
wherein the second voltage is applied following the end of the first duration.

19. A write method for a memory circuit, wherein the memory circuit comprises a memory cell and a selector electrically coupled to the memory cell, the method comprising:
applying a first voltage to the selector to turn on the selector, wherein a first voltage level of the first voltage is larger than a voltage threshold corresponding to the selector; and
applying a write current to the selector to program one or more bit values into the memory cell after the applying of the first voltage, wherein a write current level of the write current is constant and greater than a preset current level threshold,
wherein a first duration of the applying of the first voltage is smaller than a second duration of the applying of the write current, wherein the write current is applied following the end of the first duration.

20. The write method of claim 19, wherein after the applying of the first voltage, applying a second voltage rather than the write current to the selector to program the one or more bit values stored in the memory cell, wherein a second voltage level of the second voltage is constant and smaller than the voltage threshold, wherein a third duration of the applying of the second voltage is larger than the first duration of the applying of the first voltage, wherein the second voltage is applied following the end of the first duration.

* * * * *